(12) United States Patent
Bean et al.

(10) Patent No.: US 7,638,866 B1
(45) Date of Patent: Dec. 29, 2009

(54) STACKED PACKAGING DESIGNS OFFERING INHERENT ANTI-TAMPER PROTECTION

(75) Inventors: Reginald D. Bean, Center Point, IA (US); Alan P. Boone, Swisher, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 446 days.

(21) Appl. No.: 11/142,812

(22) Filed: Jun. 1, 2005

(51) Int. Cl.
H01L 23/02 (2006.01)

(52) U.S. Cl. .............. 257/686; 257/E25.013; 257/723; 257/738; 438/108

(58) Field of Classification Search .......... 257/E25.013, 257/738, 678, 723–725, 685, 686; 438/108, 438/599
See application file for complete search history.

(56) References Cited

U.S. PATENT DOCUMENTS

| | | | | |
|---|---|---|---|---|
| 4,335,459 A | * | 6/1982 | Miller | 714/755 |
| 5,491,612 A | * | 2/1996 | Nicewarner, Jr. | 361/760 |
| 5,646,446 A | * | 7/1997 | Nicewarner et al. | 257/723 |
| 5,766,975 A | * | 6/1998 | Templeton et al. | 438/107 |
| 6,014,080 A | * | 1/2000 | Layson, Jr. | 340/573.1 |
| 6,979,895 B2 | * | 12/2005 | Akram et al. | 257/686 |
| 7,511,968 B2 | * | 3/2009 | Goodwin | 361/803 |
| 2002/0053723 A1 | * | 5/2002 | Matsuura | 257/678 |
| 2002/0074652 A1 | * | 6/2002 | Pierce | 257/724 |
| 2003/0127749 A1 | * | 7/2003 | Lin et al. | 257/778 |
| 2003/0197260 A1 | * | 10/2003 | Nishimura et al. | 257/686 |

* cited by examiner

*Primary Examiner*—Chris C Chu
(74) *Attorney, Agent, or Firm*—Matthew J. Evans; Daniel M. Barbieri

(57) ABSTRACT

An electronic device includes a die, a first circuit substrate connected to the die, and a second circuit substrate closely coupled to the first circuit substrate. The die is located between the first and second circuit substrates and is protected from tampering by the close coupling of the first and second circuit substrates. The circuit substrates may be circuit carrying elements (e.g. circuit boards) or may be additional die, may be any number of other substrates, and/or may be a combination of substrates. The device may include a cavity such that the die is located in the cavity. The cavity could be formed by any number of means. The device may also include a second die connected to the second substrate such that the first die and second die are located in proximity to each other on opposite sides of the cavity.

37 Claims, 8 Drawing Sheets

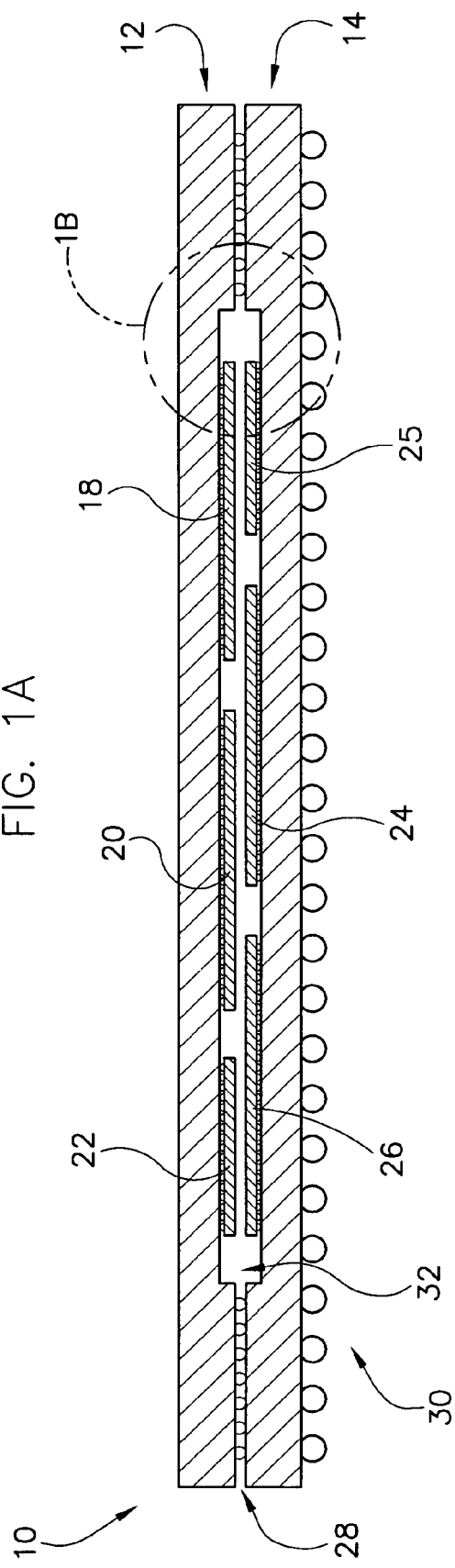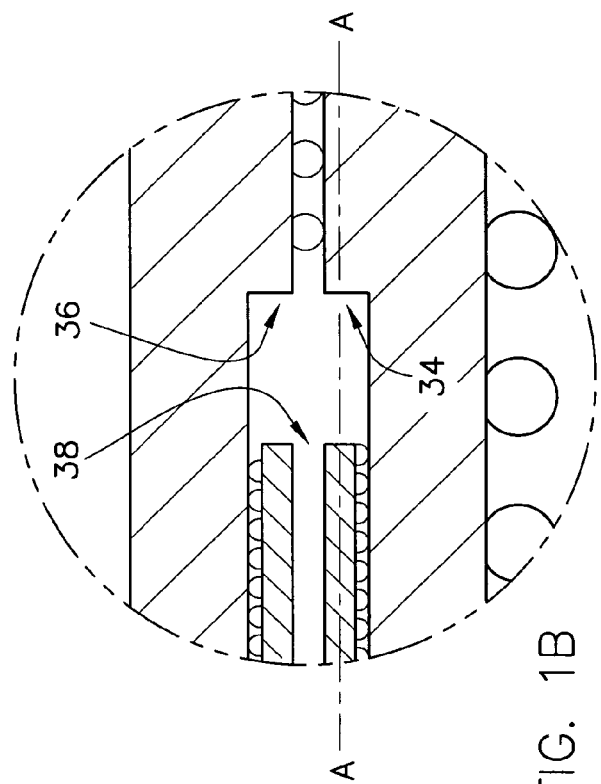

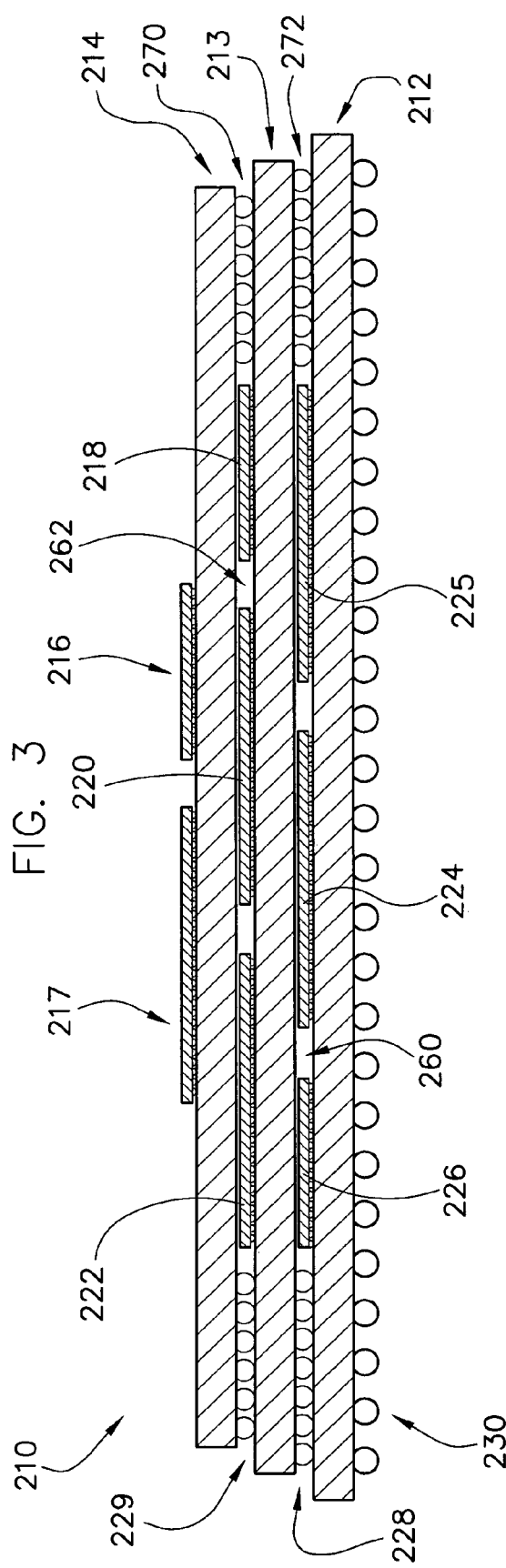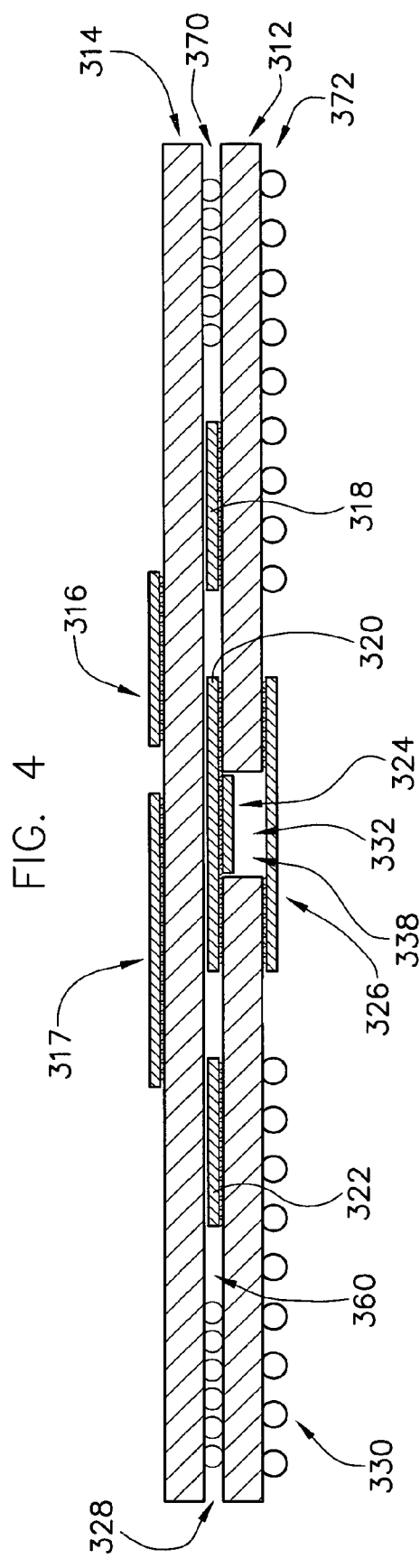

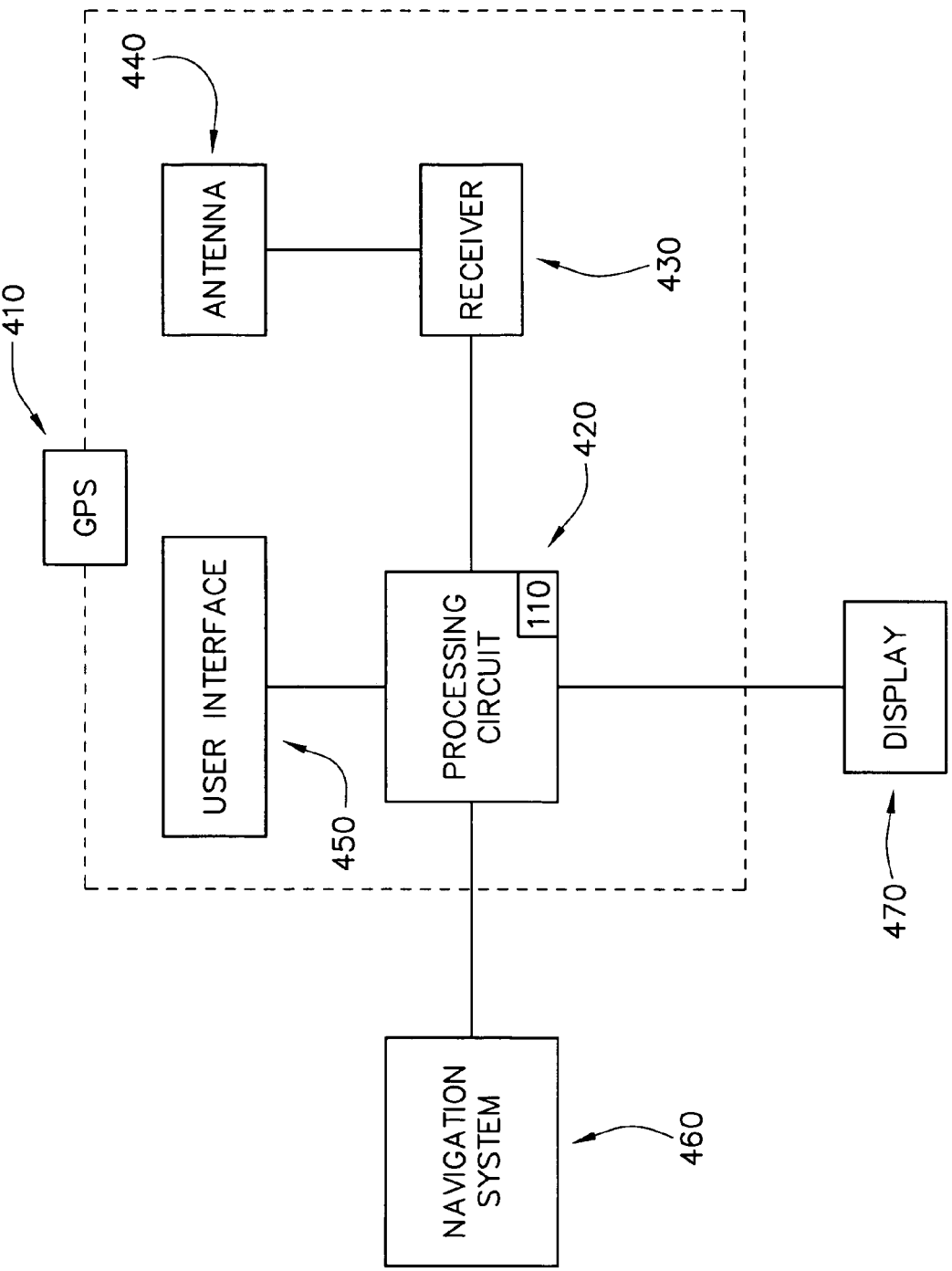

STACKED PACKAGING DESIGNS OFFERING INHERENT ANTI-TAMPER PROTECTION

GOVERNMENT INTEREST

The U.S. Government has a paid-up license in this invention and the right in limited circumstances to require the patent owner to license others on reasonable terms as provided for by the terms of Contract No. F04701-03-C-0025 relating to the MUE program.

BACKGROUND

Individual die packaged as separate components offer little inherent anti-tamper protection when sensitive information needs to be passed between the components. In the past, to improve the protection of the die and the interfaces between the die, individual die have been directly applied to a single substrate and packaged as a multi-chip module (MCM) system-in-package (SiP). Next an over-coating or over-mold was applied to the MCM to improve the security of the sensitive data internal to the MCM (on-die and between the die). In some instances these over-coatings and over-molds detrimentally impacted the cost, manufacturability and reliability of the MCM. In other instances these over-coatings and over-molds did not significantly improve the security of the MCM. Additionally, this packaging technique could result in a rather large module ranging in size from over a square inch to several square inches An alternate approach is to combine all of the individual die into a single ASIC as a system-on-chip (SoC) design. SoC designs offer a high degree of inherent anti-tamper protection and size reduction, but may present significant risk to the design and development team. The combination of all the functions needed to create the SoC may be extremely complex. There may be incompatibilities between the memory needed or other features of the die, and the die manufacturers capabilities. Additionally, a single error in the ASIC may cost $250,000 (for a metalization layer change) to $1,000,000 (for a complete respin) to correct.

Another alternative approach is to stack the die within a single package. Current stacked die packaging techniques address size reduction, but most offer little inherent anti-tamper protection. Packaging options for stacked die packages come in many forms. The two basic options for intra-package interconnect is bond wiring and bumping (flip chip packaging). Wire-bonding may connect the die to a laminate substrate using small wires, from the top, active face of the die down to the substrate. Multiple die are then stacked on top of each other and wire bonded down to a substrate. A flip chip package may basically include a thin core laminate substrate with the die inverted and soldered down using solder bumps on the die. The active face of the die may be directly connected to the substrate using a small solder bump. Multiple substrates are then stacked on top of each other either by ball grid array attachment or by wire bonding them down to a single bottom substrate.

SUMMARY

A device offers inherent anti-tamper protection. Anti-tamper protection does not necessarily mean that tampering can be prevented altogether, but rather that the ability to tamper is hindered by the construction of the device. One method of providing anti-tamper protection involves configuring a multi-layer device in a manner that hinders access to die carrying the sensitive information.

These devices may have application to any number of different types of systems where protection of certain information is desired. Such systems may include GPS location determining devices, communications devices, and/or other types of devices.

Other principle features and advantages of the invention will become apparent to those skilled in the art upon review of the drawings, the detailed description, and the appended claims.

BRIEF DESCRIPTION OF THE DRAWINGS

FIG. 1A is a cross-sectional side view of an exemplary device having inherent anti-tamper protection according to one embodiment;

FIG. 1B is an exploded view of a portion of FIG. 1A;

FIG. 3 is a cross-sectional side view of an exemplary device having inherent anti-tamper protection according to another embodiment;

FIG. 4 is a cross-sectional side view of an exemplary device having inherent anti-tamper protection according to another embodiment; and FIG. 5 is a diagram of a GPS system that includes a device such as one illustrated in FIGS. 1-4.

DETAILED DESCRIPTION OF EXEMPLARY EMBODIMENTS

Figure 1C:
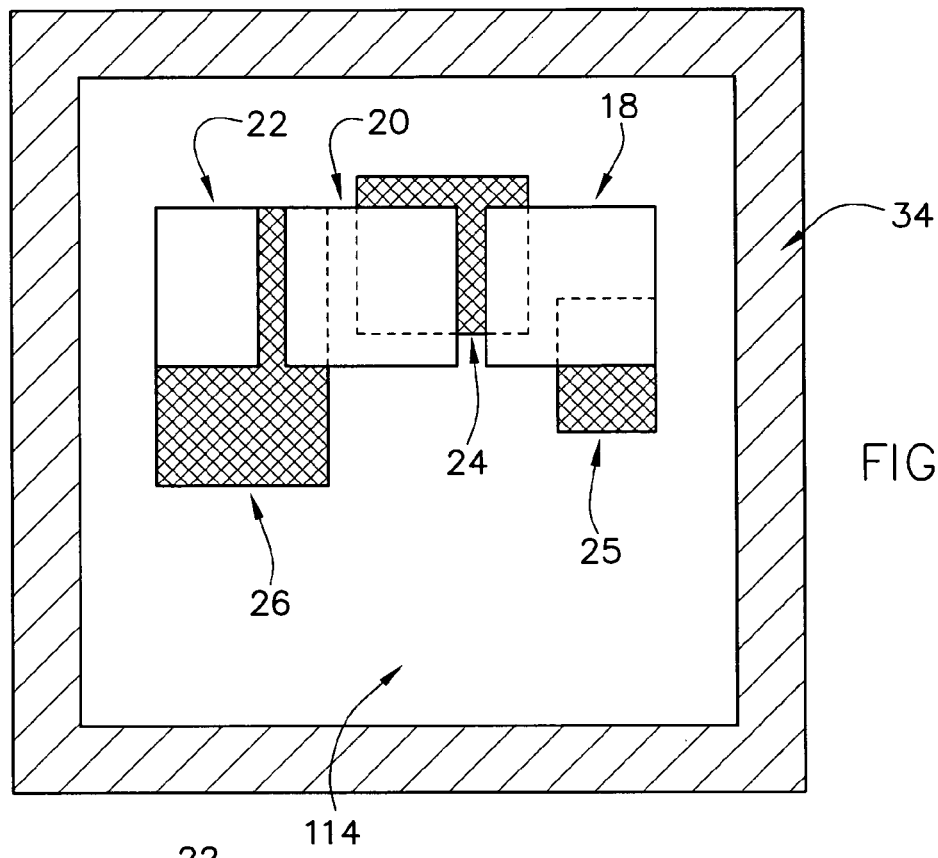
FIG. 1C is an exemplary top view of a cross section along line A-A of the device illustrated in FIG. 1A.

An electronic device is packaged in a manner that allows a higher degree of inherent anti-tamper protection. The inherent anti-tamper protection offered by the manner in which the device is packaged may reduce the need to rely on protective over-coatings and over-molds to prevent tampering with the die that are to be protected.

One method of protecting the die from tampering is to package the die in an area that is difficult to access without tampering with and/or at least partially destroying the package, particularly if it requires tampering with an active face of the die. The device may include the ability to monitor whether the package has been tampered with, and may be configured to take precautionary measures (e.g. removing data from the device, halting operation of the device, etc.) in response to detection of tampering.

To achieve protection from tampering with a die, an electronic device may include a first substrate connected to the die and a second substrate closely coupled to (e.g. directly connected to, or separated by few intervening bodie from) the first substrate. The die is located between the two substrates. The close coupling of the first substrate and the second substrate makes access to the die more difficult without tampering with the connection between the two substrates. The device may also include underfill and/or other potting material which material may create a stronger physical bond between the die, the first substrate, and the second substrate. Further, the loss of interconnect between the first substrate and the second substrate may result in the device detecting the tampering and taking precautionary measures (e.g. removing data from the device, halting operation of the device, etc.).

Either or both of the first and second substrate may be circuit carrying elements (e.g. printed circuit boards, flex circuits, etc.) that include electrical connections (conductive paths/conductive traces, vias, etc.) and are configured to carry circuit elements (e.g. the die) and electrically connect them to other circuit elements by way of the electrical connections. Either or both of the substrates may be formed from a laminate material, and/or from some other material (e.g. silicon).

The electronic device may be a component of a system, such as a GPS receiver system. The electronic device may include information related to decoding tracking data, algorithms relating to determining a location from the tracking data, and/or to other information. The electronic device may additionally include information related to the encryption and decryption of sensitive data as a component in a system such as a banking system handling sensitive account information. The electronic device may additionally include information related to the encryption and decryption of sensitive data as a component in a system such as a communications system handling digital communications such as email, audio, data files, and other digital data. This information may be contained in one or more die which is/are protected from tampering as discussed above.

The GPS device may further include an antenna and/or a receiver configured to receive data, which data would likely be received from GPS satellites. The GPS device may also contain a data output portion such that data relating to the position of the GPS device may be distributed to another system (e.g. a navigation system, a display, etc.).

A banking system may further include a mechanism for remote data entry, a means to transmit the data, and a server.

A communications system may consist of multiple radios with transmit and receive capabilities.

Referring to FIGS. 1A-B, one electronic device whose packaging provides inherent anti-tamper protection comprises a first laminate circuit board 12 closely coupled (here, directly connected) to a second laminate circuit board 14. Laminate boards 12, 14 include sides 36, 34 that are built up towards each other and form a cavity 32 when boards 12, 14 are placed in close proximity to each other (here, connected by a ball grid array 28). Board 14 is configured to be placed in a larger assembly and communicate information by way of ball grid array 30.

Die 18, 20, 22, 24-26 are located in space 38 between boards 12 and 14, which form cavity 32. Locating die 18-26 in cavity 32 may tend to inhibit access to die 18, 20, 22, 24-26 unless an intruder tampers with at least one other portion of device 10 (e.g. boards 12, 14, ball grid array 28, and so on). One of die 18, 20, 22, 24-26 may be configured to monitor for tampering with another portion of device 10 and may be configured to remove data from and/or halt operation of one or more die if tampering is detected.

Die 18, 20, 22 are located on an opposite side of cavity 32 than die 24-26. Die 18, 20, 22 are flip chip connected to board 12 and die 24-26 are flip chip connected to board 14. Die 18, 20, 22 have an active face that faces board 12, and die 24-26 have an active face that faces board 14. None of die 18, 20, 22 are directly connected to any of die 24-26, although they may be operatively connected by way of boards 12, 14 and/or ball grid array 28. Die 18, 20, 22 and 24-26 may be fixed in locations with respect to each other by an underfill or other potting material that is directly or indirectly connected to one or more of the die.

As illustrated in FIG. 1C, the built up portions of sides 34, 36 extend around substantially the entire (here, the entire) perimeter of cavity 32. Thus, die 18, 20, 22, 24-26 are substantially enclosed in cavity 32. In this embodiments, boards 12, 14 are substantially planar and formed substantially in the plane of the paper. Die 18 partially overlaps each of die 24 and 25 in a plane orthogonal to the plane of boards 12, 14 (e.g. the plane of the paper in FIG. 1A).

Figure 1D:
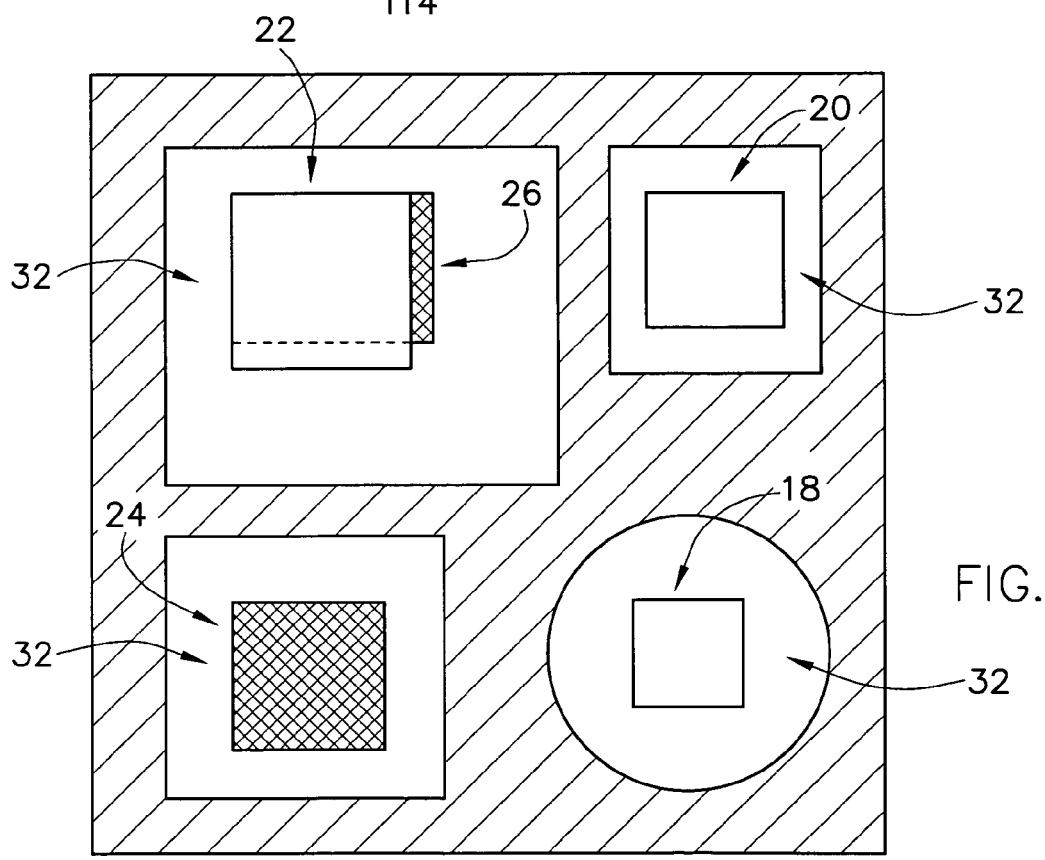
FIG. 1D is an additional exemplary top view of a device constructed in a manner consistent with the device illustrated in FIG. 1A

While a single chamber is shown in cavity 32 in FIG. 1C, the device may include a plurality of separate chambers as illustrated in FIG. 1D. Each chamber may include one or more die.

Figure 2A:
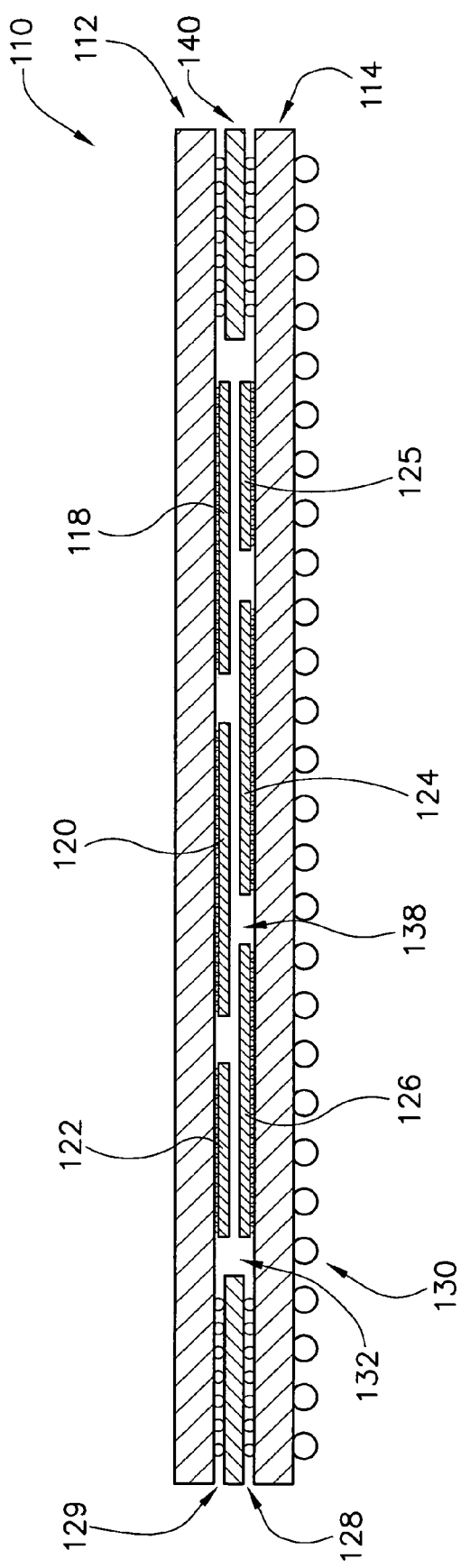
FIG. 2A is a cross-sectional side view of an exemplary device having inherent anti-tamper protection according to another embodiment.

Referring to FIG. 2A, another electronic device 110 whose packaging provides inherent anti-tamper protection comprises a first laminate circuit board 112 closely coupled to a second laminate circuit board 114. Device 110 also includes a laminate ring 140 disposed between boards 112 and 114. In some versions of this embodiment, ring 140 may be thinner than boards 112 and 114. Ring 140 is electrically connected to board 112 by way of ball grid array 129 and is electrically connected to board 114 by ball grid array 128. Board 114 is configured to be connected to an assembly and communicate information by way of ball grid array 130.

Die 118, 120, 122, 124-126 are located in the space 138 between boards 112 and 114, which form cavity 132. Locating die 118, 120, 122, 124-126 in cavity 132 may tend to inhibit access to die 118, 120, 122, 124-126 unless an intruder tampers with at least one other portion of device 110 (e.g. boards 112, 114, ring 140, ball grid arrays 128, 129, etc.). Die 118, 120, 122, 124-126 are at least partially located in a common plane (e.g. a plane parallel to the plane of the paper in FIG. 2B) with ring 140. One or more of die 118, 120, 122, 124-126 may be configured to monitor for tampering with other portions of device 110 and/or may be configured to remove data from one or more die and/or halt operation if tampering is detected.

Die 118, 120, 122 are located on an opposite side of cavity 132 than die 124-126. Die 118, 120, 122 are flip chip connected to board 112 and die 124-126 are flip chip connected to board 114. Die 118, 120, 122 have an active face that faces board 112, and die 124-126 have an active face that faces board 114. None of die 118, 120, 122 are directly connected to any of die 124-126, although they may be operatively connected by way of boards 112, 114, ring 140, and/or ball grid arrays 128, 129. Die 118, 120, 122 and 124-126 may be fixed in locations with respect to each other by an underfill or other potting material that is directly or indirectly connected to one or more of the die.

In some embodiments, ring 140 may be a circuit carrying element and/or may be configured to facilitate electrical connection of boards 112 and 114. In some of these embodiments, ring 140 has electrical connections that are passed directly from board 112 to board 114 in the same pattern as received from boards 112 and 114. In other embodiments, ring 140 may be used to reroute some or all of the electrical connections, such that the connections are arranged differently on boards 112 and 114. A different arrangement could include a same arrangement of connectors (balls) with different components of boards 112 and 114 associated with the same connector location in arrays 128 and 129, may include a different arrangement of connectors in the array, may include some combination of these features, and/or may include some other/additional features.

Figure 2B:
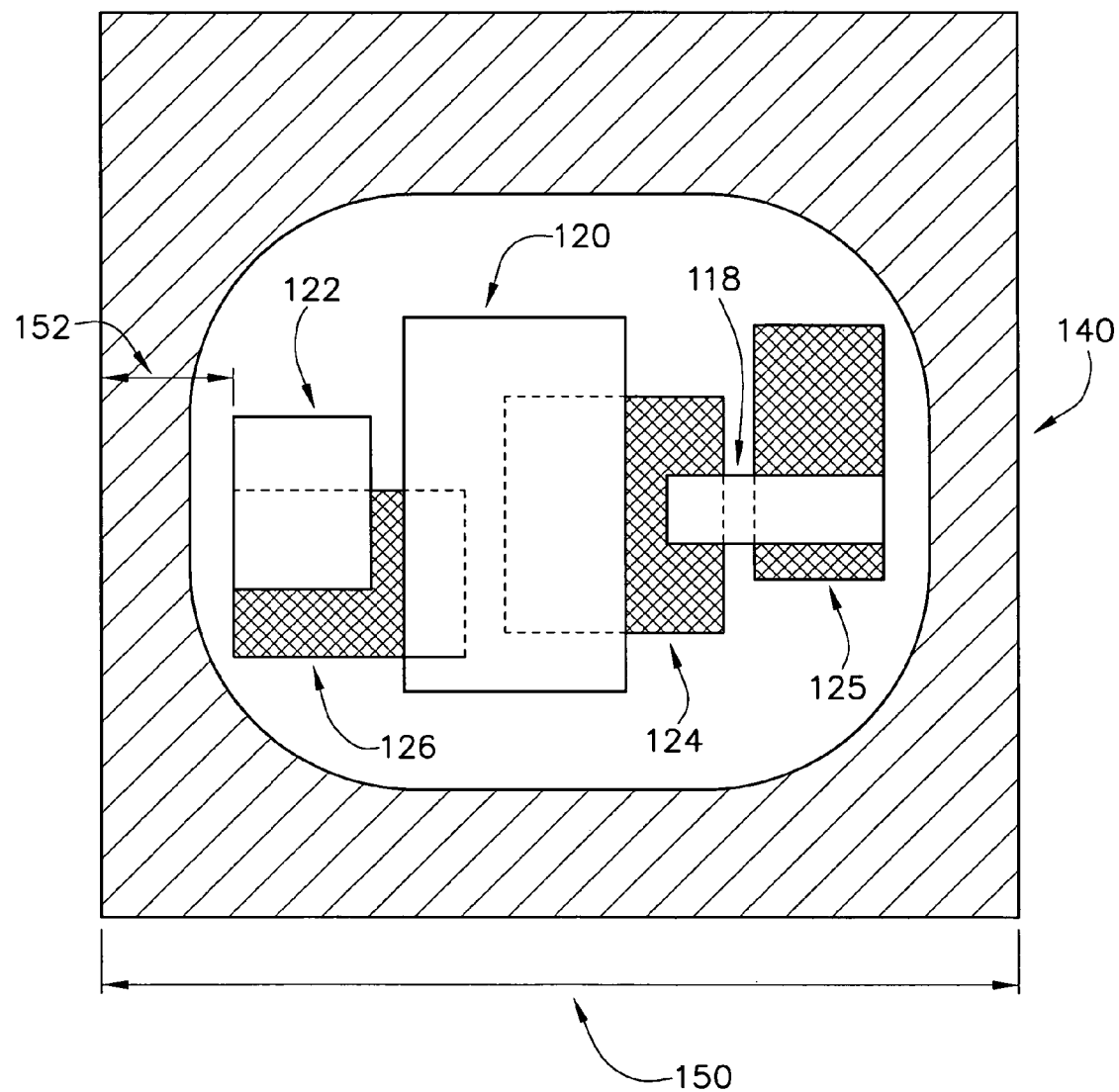
FIG. 2B an exemplary top view of a cross section of the device illustrated in FIG. 2A.

Referring to FIG. 2B, ring 140 may extend around substantially the entire perimeter of boards 112, 114. In some embodiments, the width 152 of the sides of ring 140 may be substantially less than the overall width 150 of ring 140. In some embodiments, the width 152 of the edges is no more than about ⅓ or ⅕ of the width 150 of the ring 140. In other embodiments, the width 152 of ring 140 may be large compared to the width 150 of ring 140 and/or boards 112, 114.

Figure 2C:
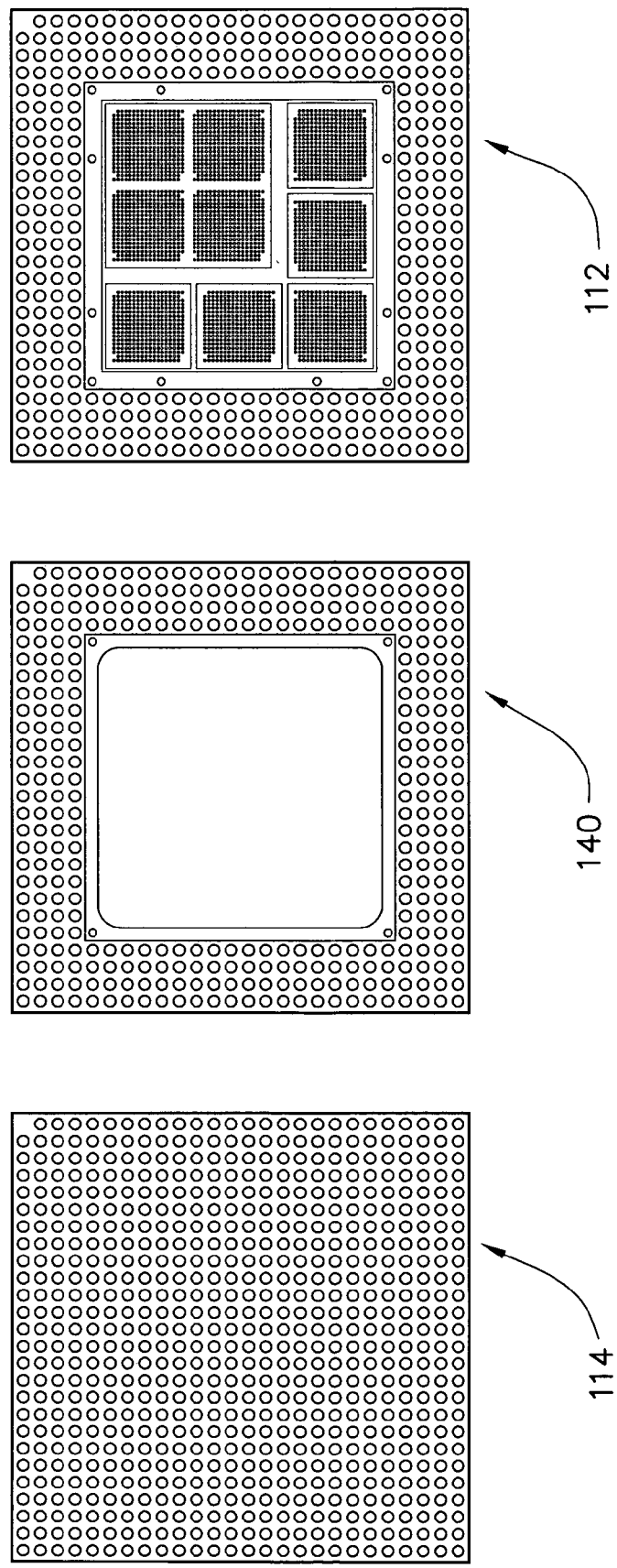
FIG. 2C is an alternate top view of the boards and ring of the device illustrated in FIG. 2B.
Figure 2D:
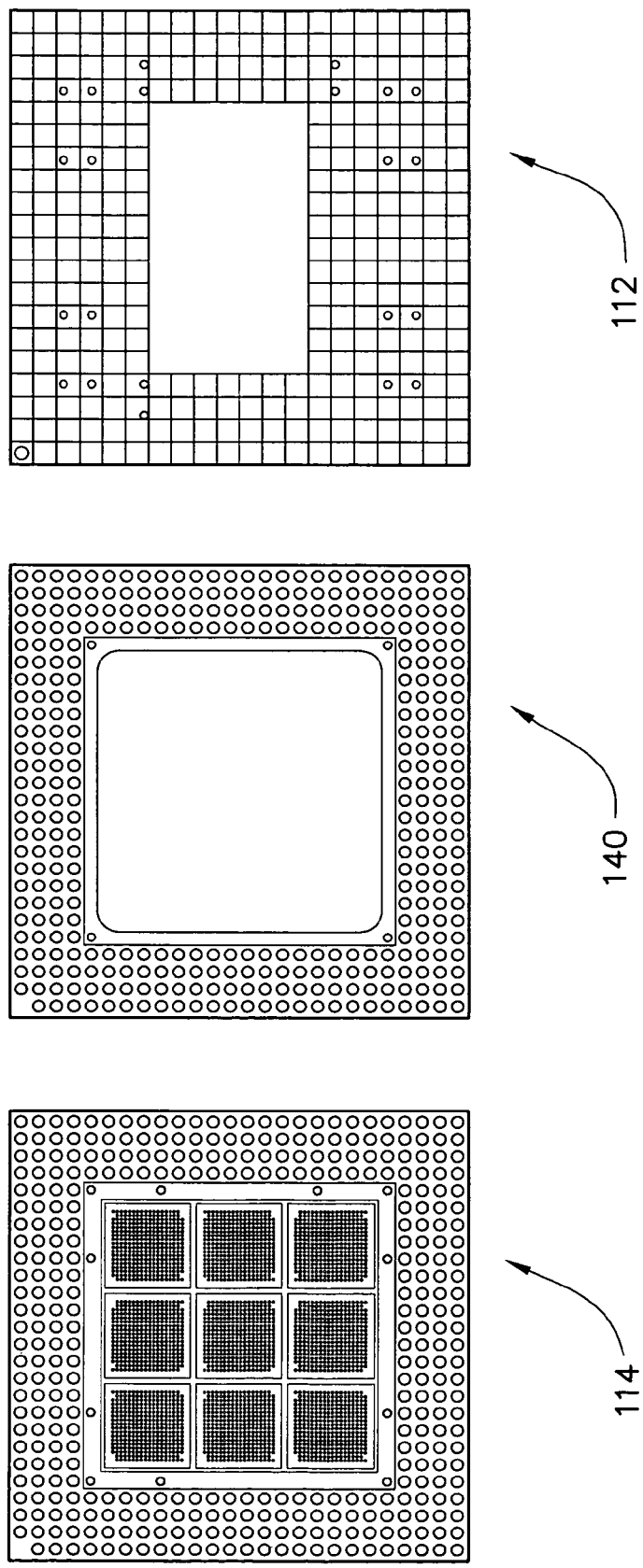
FIG. 2D is a bottom view of the boards and ring of the device illustrated in FIG. 2C.

Referring to FIGS. 2C and 2D, ring 140 may extend around substantially the entire perimeter of boards 112, 114. Ring 140 may be a polygonal (e.g. rectangular) shape and may have a polygonal (e.g. rectangular) hole. The width of the sides of ring 140 may be uniform or may be differently shaped. The hole in ring 140 may be centered in ring 140 or may be located closer to one side than another side.

Ring 140 is shown in FIGS. 2B-D as being formed from a single piece, but ring 140 could be formed by a plurality of pieces that, when placed in device 110, form a ring structure. Also, while ring 140 is shown being placed near the periphery of boards 112, 114 in FIG. 2A, ring 140 may be located anywhere, such as closer to the center, in a corner, etc. Additionally, while ring 140 is shown having a circular interior portion, ring 140 may have any number of interior shapes; ring 140 may have a diamond shaped interior portion, a rectangular interior portion, or some other shaped interior portion. Ring 140 may have several different interior spaces in a similar manner to the built-up portions of FIG. 1D.

Referring to FIG. 3, another electronic device 210 whose packaging provides inherent anti-tamper protection comprises a first laminate circuit board 112 directly connected to a second laminate circuit board 213 which is directly connected to a third laminate circuit board 214. Board 213 is electrically connected to board 212 by way of ball grid array 228 and is electrically connected to board 214 by ball grid array 229. Board 212 is configured to be connected to an assembly and communicate information by way of ball grid array 230.

Die 224-226 are located in space 260 between boards 212 and 213. Die 218, 220, 222 are located in space 262 between boards 213 and 214. Die 216 and 217 are located on board 214 and are mounted facing an exterior of device 210. Underfill may be used to fill in any of the spaces 260, 262 not taken up by die 218, 220, 222, 224-226.

Die 218, 220, 222, 224-226 are all mounted on a common circuit carrying board 213. Die 218, 220, 222 are located on a first face 270 of board 213. Die 224-226 are located on a second face 272 of board 213, opposite first face 270. Die 218, 220, 222, 224-226 are flip chip connected to board 213. Die 218, 220, 222 have an active face that faces the first face 270 of board 213, and die 224-226 have an active face that faces the second face of board 213.

Board 213 may carry various circuit traces that electronically connect two or more of die 218, 220, 222, 224-226 to each other. Board 213 may be used to transfer data between die 217 and 218 on board 214 and other die and/or other parts of a system.

Locating die 218, 220, 222, 224-226 in spaces 260, 262 and making the circuit connections using a board 213 surrounded by other boards 212, 214 may tend to inhibit access to die 218, 220, 222, 224-226 and may inhibit knowledge of their interconnection unless an intruder tampers with at least one other portion of device 210 (e.g. boards 212, 214, ball grid arrays 228, 229, and so on). One or more of die 218, 220, 222, 224-226 may be configured to monitor for tampering with another portion of device 210 and/or may be configured to remove data from one or more die and/or halt operation if tampering is detected. Die 216 and 217 may be left unprotected, or may be protected by other means.

Referring to FIG. 4, another electronic device 310 whose packaging provides inherent anti-tamper protection comprises a first laminate circuit board 312 directly connected to a second laminate circuit board 314 by a ball grid array 328. Board 312 is configured to be connected to an assembly and communicate information by way of ball grid array 330. A space is created in ball grid array 330 where die 326 is located.

Die 318, 320, 322 are located in space 360 between boards 312 and 314. Die 316 and 317 are located on board 314 and are mounted facing an exterior (top side) of device 310. Die 326 is located on board 312 and is mounted facing an exterior (under side) of device 310. Die 324 is located on die 320 and is located in a cavity/space 332/338 created in board 312. Underfill may be used to fill in any of the spaces 332, 360 not taken up by die 318, 320, 322, 323, 324 particularly the space not taken up by die 324 in cavity 332.

Die 318, 320, 322 and 326 are all mounted on a common circuit carrying board 312. Die 318, 320, 322 are located on a first face 370 of board 312. Die 326 is located on a second face 372 of board 312, opposite first face 370. Die 318, 320, 322, and 326 are flip chip connected to board 312. Die 320 and 326 are located over and cover (here, entirely cover) cavity 332 in board 312. Cavity 332 is substantially enclosed by board 312, die 326, and die 320. Die 324 is flip chip connected to die 320. Die 318, 320, 322, have an active face that faces the first face 370 of board 312, die 326 has an active face that faces the second face 372 of board 312, and die 324 has an active face that faces die 320 (which is an active face of die 320).

Board 312 may carry various circuit traces that electronically connect two or more of die 318, 320, 322 and 326 to each other. Board 312 may be used to transfer data between die 317 and 318 on board 314 and other die and/or other parts of a system.

Locating die 324 in cavity 332, mounted to die 320, and covered by die 326 may tend to inhibit access to die 324 unless an intruder tampers with at least one other portion of device 310 (e.g. board 312, die 320 and 326, and so on). One or more of die 318, 320, 322, 324, 326, may be configured to monitor for tampering with another portion of device 310 and/or may be configured to remove data on one or more die and/or halt operation if tampering is detected. Die 316 and 317 may be left unprotected, or may be protected from tampering by other means.

Die 18, 20, 22, 24-26, 118, 120, 122, 124-16, 218, 220, 224-226, and 324 may be comprised of any number of components. For example, these die may consist of memory (flash, Ram, etc.), processing circuits such as one or more microprocessors, a GPS engine, an ASIC, a battery power supply (e.g. Li thin film battery), and/or recharging circuitry configured to assist in recharging a battery. In one embodiment, the die include an ASIC (which may comprise one microprocessor, a pair of microprocessors, or multiple microprocessors in addition to other processing components) configured to execute GPS tracking functions and a flash memory configured to contain sensitive data pertaining to GPS tracking operation.

Devices 10, 110, 210, and 310 may be formed in any size. According to some embodiments, the devices may have a length and/or width of up to about two inches, one inch, and/or of up to about one-half of an inch. According to some embodiments, the devices may have a height of up to about one-half of an inch, and/or of up to about one-quarter of an inch. Boards 12, 14, 112, 114, 140, 212, 213, 214, 312 and 314 may include blind vias configured to transfer electronic data from one face of the board to another face of the board.

The packaging of the substrates and the die may be configured to be monitorable to determine if tampering is occurring.

According to most embodiments, the die to be protected are completely enclosed by the substrate structures. According to many of these embodiments, the die to be protected are potted using a rigid underfill material to further hinder access to the die.

Referring to FIG. 5, a global positioning device 410 includes a receiver 430 configured to receive data from a global positioning system transmitter such as global positioning satellites. Receiver 430 may include an antenna 440 to aid in receiving the data. Receiver 430 is coupled to a processing circuit 420 which processes data received from receiver 430 to derive data indicative of a location of global positioning device 410. In many embodiments, receiver 430 is part of processing circuit 420, thus a reference to a processing circuit and a receiver does not necessarily mean that they are distinct components unless stated otherwise. Processing circuit 420 can include various types of processing circuitry, digital and/or analog, and may include a microprocessor, microcontroller, application-specific integrated circuit (ASIC), field programmable gate arrays (FPGA), and/or other circuitry configured to perform various input/output, control, analysis, and other functions to be described herein. Processing circuit 420 can digitize the data, can filter the data, can analyze the data, can combine the data, and/or can process the data in some other manner. Processing circuit 420 may also include a memory (volatile or non-volatile) that stores data. Processing circuit 420 may be contained in a single unit, or may include several distinct parts. Processing circuit 420 may include a device 110 (also 10, 210, 310) carrying die that are inherently protected from tampering based on the packaging configuration of device 110. Global positioning device 410 may also include a user interface 450.

Data from processing circuit 420 may be transferred to a navigation system 460 and/or display 470. Navigation system 460 and/or display 470 may be components of global positioning device 410. For example, processing circuit 420 may be configured to process location data and provide navigation information based on the processed location data.

Device 110 of processing circuit 420 may be configured to carry information such as classified data pertaining to GPS tracking operation and/or other data necessary to determine location data based on the data received from receiver 430.

Exemplary Embodiments

One embodiment is directed to an electronic device. The device includes a die, a first substrate connected to the die, and a second substrate coupled to the first substrate with few or no intervening structures (e.g. merely a ring 140, ball grid array 128 and/or 129, etc.). The die is located between the first substrate and the second substrate and is protected from tampering by the arrangement of the first substrate and the second substrate in close proximity to each other. In many of these embodiments, the first and second substrates are circuit carrying elements such as printed circuit boards. In some of these embodiments, one or more of the first and second substrates may be another die. In some of these embodiments, the first and/or second substrate may be formed from a laminate material. In some of these embodiments, the die may be located in a cavity. The cavity may be formed using the first and second substrates and/or may be formed using another material (e.g. a ring or some other structure) which does not substantially separate the first and second substrates.

Another embodiment is directed to an electronic device that includes a first die, a second die in proximity to the first die but not directly electrically connected to the first die, a first substrate connected to the die; and a second substrate closely coupled to the first substrate. The first die and the second die are located between the first substrate and the second substrate. The first die and the second die are not directly electrically connected to a same substrate.

Another embodiment is directed to an electronic device that includes a first die, a second die in proximity to the first die but not directly electrically connected to the first die, a first substrate connected to the die; and a second substrate closely coupled to the first substrate. The first die and the second die are located between the first substrate and the second substrate. The first substrate is located along a first plane and the first and second die are both at least partly included in a second plane that is orthogonal to the first plane.

Another embodiment is directed to an electronic device that includes a first die and a second die connected to different faces of a first substrate. A second substrate is connected to the first substrate and the die is located between the first substrate and the second substrate. The device may further include a third substrate that is connected to the first substrate, and the second die may be located between the first substrate and the third substrate.

Another embodiment is directed to an electronic device that includes a first die connected to a second die, a first substrate closely coupled to the second die, and a second substrate having a hole. The second die is connected to the second substrate such that the first die is located in the hole in the second substrate. The first substrate covers the hole in the second substrate such that the first die is located between the second die and the first substrate.

Another embodiment is directed to an electronic device that includes a first circuit carrying element substrate, a second circuit carrying element substrate closely coupled to the first circuit carrying element, a first die connected to the first substrate, a second die connected to the second substrate, and a space located between the first substrate and the second substrate. The first die and the second die are located in the space. The space may be a cavity located between the first substrate and the second substrate. The cavity may be formed by a ring located between the first and second substrates.

The devices of any of the above described embodiments may be incorporated in a GPS system. The GPS system may include the device, a receiver, a display, and/or any number of other components. One or more of the protected die may include a processing circuit configured to contain algorithms or other information relating to interpreting tracking data received by the receiver from the GPS system.

The devices of any of the above described embodiments may be incorporated in some other type of system to inhibit tampering with information contained in a protected die. For example, the device may be used to protect proprietary algorithms used in an airplane control or display system, used in a cell phone, used in radios, used in hand-held devices, and/or used in some other device/system.

While the exemplary and illustrative embodiments illustrated in the Figs. and described above are presently preferred, it should be understood that these embodiments are offered by way of example only.

While offering packaging with inherent anti-tamper protection may reduce the need for an over-coatings or over-molds of the electronic devices discussed above, an over-coating or over-mold could still be applied to the electronic devices.

Any appropriate underfill material may be selected for devices 10, 110, 210, 310 if underfill or some other potting material is used in the device. The underfill may also be selected to help dissipate heat.

While flip chip connections and ball grid arrays have been shown as the primary means of interconnecting various components, other types of connections (e.g. wire bonds) may also be used in some embodiments.

While the electronic devices described above are suited for GPS devices, they may also be used for any number of other devices where it is desirable to protect information from tampering. For example, a proprietary software algorithm may be protected from tampering by placing the software on a die that is protected from tampering, as discussed above.

Accordingly, the present invention is not limited to a particular embodiment, but extends to various modifications that nevertheless fall within the scope of the claims or the invention as a whole

What is claimed is:

1. An electronic device, comprising:
a first die;
a second die;
a first substrate having a first cavity and connected to the first die via a flip chip connection in the first cavity; and
a second substrate having a second cavity and connected to the second die via a flip chip connection in the second cavity;
wherein the first die and the second die are offset to each other located between the first substrate and the second substrate and are protected from tampering by a ball grid array connection of the first substrate and the second substrate, wherein the first substrate is coupled to the second substrate by the ball grid array connection disposed about a periphery of the first cavity and the second cavity and the ball grid array connection surrounds the first cavity and the second cavity, wherein the first and second substrates completely enclose the first and second die.

2. The device of claim 1, wherein at least one of the first and second substrates are laminate substrates.

3. The device of claim 1, wherein both the first and second substrates are laminate substrates.

4. The device of claim 1, wherein the first substrate and the second substrate are circuit carrying elements.

5. The device of claim 1, wherein the first die is soldered to the first substrate.

6. The device of claim 5, wherein a perimeter of at least one of the first and second substrates is built up and contributes to the formation of the cavity.

7. The device of claim 1, wherein
the first substrate is located along a first plane and the first and second die are both at least partly included in a second plane that is orthogonal to the first plane.

8. The device of claim 7, wherein the first die is connected to the first substrate via solder and the second die is flip chip connected to the second substrate via solder.

9. The device of claim 1, wherein the ball grid array connection is disposed about a ring member.

10. The device of claim 1, wherein the second substrate is connected to the first substrate by a solder connection.

11. The device of claim 1, further comprising a potting material between the first substrate and the second substrate.

12. The device of claim 11, wherein the potting material comprises a heat dissipating potting material.

13. The device of claim 1, wherein at least one of the first die or the second die comprises a memory configured to store data relating to a GPS tracking operation and wherein at least one of the first die or the second die comprises a processing circuit configured to execute at least one GPS tracking function based on data received from a global positioning satellite system.

14. The device of claim 13, wherein at least one of the first die or the second die comprises an application specific integrated circuit configured to execute a function related to at least one GPS tracking function.

15. The device of claim 1, further comprising a power supply connected at least one of the first and second substrates.

16. The device of claim 1,
further comprising a third die;
wherein the first substrate is located along a first plane and the first and second dies are both at least partly included in a second plane that is orthogonal to the first plane;
the second and third dies are both at least partly included in a third plane that is orthogonal to the first plane;
wherein the first die is not located in the third plane; and
the third die is not located in the second plane.

17. The device of claim 1, wherein
the first die is connected to a first face of the first substrate, wherein the device further comprises a plurality of solder connections on a second face of the first substrate, the solder connections configured to connect the device to an assembly and provide a data connection between the device and the assembly; and
the second face of the first substrate is not connected to any dies.

18. An electronic device, comprising:
a first and second die;
a first substrate having a first cavity connected to the first die via a flip chip connection in the first cavity; and
a second substrate having a second cavity and being coupled to a second die by a flip chip connection in the second cavity, the second substrate closely coupled to the first substrate via a ball grid array connection;
wherein the first and second die are offset to each other located between the first substrate and the second substrate and are protected from tampering by the close coupling of the first substrate and the second substrate, wherein the first substrate is coupled to the second substrate by a ball grid array connection disposed about a periphery of the first cavity and the second cavity and the ball grid array connection surrounds the first cavity and the second cavity;
wherein the first die comprises a processing circuit.

19. The device of claim 18, wherein the processing circuit is configured to execute at least one GPS tracking function based on data received from a global positioning satellite system, and the device further comprises a memory configured to store data relating to a GPS tracking operation, the memory connected to at least one of the first substrate and the second substrate.

20. The device of claim 19, further comprising an application specific integrated circuit configured to execute a function related to at least one GPS tracking function, the application specific integrated circuit connected to at least one of the first substrate and the second substrate.

21. The device of claim 18, wherein the first substrate is connected to the second substrate by solder connections.

22. The device of claim 18, further comprising a plurality other dies connected to the second substrate, wherein the plurality of other dies are located between the first substrate and the second substrate.

23. The device of claim 18, wherein the device further comprises a plurality of additional dies located between the first substrate and the second substrate; and each of the first die and the plurality of additional dies are functionally connected to perform a global positioning system tracking function.

24. An electronic device, comprising:
a first circuit carrying element substrate having a first cavity;
a second circuit carrying element substrate having a second cavity and connected to the first circuit carrying element via a ball grid array connection about a periphery of the first cavity and the second cavity;
a first die connected to the first substrate in the first cavity by a flip chip connection;
a second die connected to the second substrate in the second cavity by a flip chip connection;
a space located between the first substrate and the second substrate;
wherein the first die and the second die are offset to each other located in the space, wherein the first circuit carrying element substrate is coupled to the second circuit carrying element substrate by a ball grid array connection disposed about a periphery of the first cavity and the second cavity and the ball grid array connection surrounds the first cavity and the second cavity.

25. The device of claim 24, wherein an active face the first die faces the first substrate and an active face of the second die faces the second substrate.

26. The device of claim 24, wherein the second die is flip chip connected to the second substrate using solder.

27. The device of claim 24, wherein at least one of the first substrate and the second substrate is built up on a face on which one of the first and second die is connected.

28. The device of claim 24, wherein the device is a GPS device.

29. The device of claim 24, wherein the first substrate is located along a first plane and the first plurality die and the second die are both at least partly included in a second plane that is orthogonal to the first plane.

30. A global position system device, comprising:
a first die directly connected to first a cavity in a first substrate via a flip chip connector;
a second die directly connected to a second cavity in a second substrate via a flip chip connector; and
a potting material between the first substrate and the second substrate;
wherein the second substrate is directly connected to the first substrate by a ball grid array solder connection about a periphery of the first substrate and the second substrate;
wherein the first and second die are offset to each other located between the first substrate and the second substrate and are protected from tampering by the close coupling of the first substrate and the second substrate, wherein the first circuit carrying element substrate is coupled to the second circuit carrying element substrate by a ball grid array connection disposed about a periphery of the first cavity and the second cavity and the ball grid array connection surrounds the first cavity and the second cavity;
wherein at least one die of the first or second die comprises a memory configured to store data relating to a GPS tracking operation; and
wherein at least one die of the first or second die comprises a processing circuit configured to execute at least one GPS tracking function based on data received from a global positioning satellite system.

31. The global positioning system device of claim 30, further comprising a third die directly connected to the first substrate.

32. The global positioning system device of claim 31, further comprising a fourth die directly connected to the second substrate.

33. The global positioning system device of claim 30, wherein the potting material comprises a heat dissipating potting material.

34. The global positioning system device of claim 30 wherein at least one of the first or the second die comprises an application specific integrated circuit configured to execute a function related to at least one GPS tracking function.

35. The global positioning system device of claim 34, wherein
the first die comprise the memory configured to store data relating to a GPS tracking operation;
the second die comprise the processing circuit configured to execute at least one GPS tracking function based on data received from a global positioning satellite system; and
wherein a third die comprises the application specific integrated circuit configured to execute a function related to at least one GPS tracking function;
the device further comprises a fourth die connected to the second substrate, the third die comprising a memory configured to store data relating to a GPS function; and
the fourth die is located between the first substrate and the second substrate.

36. The global positioning system device of claim 30, wherein
the first die is connected to a first face of the first substrate,
the device further comprises a plurality of solder connections on a second face of the first substrate; and
the second face of the first substrate is not connected to any dies.

37. The global positioning system device of claim 30, wherein the potting material comprises a rigid potting material.

* * * * *